(12) United States Patent
Takami et al.

(10) Patent No.: US 6,626,967 B2
(45) Date of Patent: Sep. 30, 2003

(54) POLISHING COMPOSITION AND POLISHING METHOD EMPLOYING IT

(75) Inventors: Shinichiro Takami, Aichi (JP); Katsuyoshi Ina, Aichi (JP)

(73) Assignee: Fujimi Incorporated, Nishikasugai-gun (JP)

( * ) Notice: Subject to any disclaimer, the term of this patent is extended or adjusted under 35 U.S.C. 154(b) by 0 days.

(21) Appl. No.: 10/283,087

(22) Filed: Oct. 30, 2002

(65) Prior Publication Data

US 2003/0115806 A1 Jun. 26, 2003

(30) Foreign Application Priority Data

Oct. 31, 2001 (JP) ........................................ 2001-334107

(51) Int. Cl.⁷ ............................. C09G 1/02; C09G 1/04; B24B 1/00
(52) U.S. Cl. ............................. 51/308; 106/3; 438/692; 438/693
(58) Field of Search ............................. 51/308; 106/3; 438/692, 693

(56) References Cited

U.S. PATENT DOCUMENTS

| | | | | |
|---|---|---|---|---|
| 4,240,919 A | * | 12/1980 | Chapman | .................... 510/369 |
| 5,713,969 A | * | 2/1998 | Shibata et al. | ................. 51/307 |
| 5,800,577 A | * | 9/1998 | Kido | ............................ 51/307 |
| 5,885,949 A | * | 3/1999 | Stamm | ........................ 510/180 |
| 6,027,669 A | | 2/2000 | Miura et al. | |
| 2002/0032987 A1 | * | 3/2002 | Steckenrider et al. | ......... 51/309 |

FOREIGN PATENT DOCUMENTS

| | | |
|---|---|---|
| JP | 10-310766 | 11/1998 |
| JP | 11-80707 | 3/1999 |
| JP | 11-186201 | 7/1999 |
| WO | WO 99/63960 | * 12/1999 |

\* cited by examiner

*Primary Examiner*—Michael Marcheschi
(74) *Attorney, Agent, or Firm*—Oblon, Spivak, McClelland, Maier & Neustadt, P.C.

(57) ABSTRACT

A polishing composition comprising the following components (a) to (c):

(a) colloidal silica;
(b) at least one bicarbonate selected from the group consisting of ammonium bicarbonate, lithium bicarbonate, potassium bicarbonate, sodium bicarbonate and a mixture thereof; and
(c) water;

wherein the concentration of each of the elements included in Groups 2A, 3A, 4A, 5A, 6A, 7A, 8A, 1B and 2B, lanthanoid and actinoid, and the concentration of each element of aluminum, gallium, indium, thallium, tin, lead, bismuth, fluorine and chlorine, are at most 100 ppb in the polishing composition, respectively.

8 Claims, 1 Drawing Sheet

POLISHING COMPOSITION AND POLISHING METHOD EMPLOYING IT

BACKGROUND OF THE INVENTION

1. Field of the Invention

The present invention relates to a polishing composition suitable for planarization of the surface of semiconductor devices. More particularly, the present invention relates to a polishing composition which scarcely produces polishing scratches and which is readily cleansable after polishing, in polishing of semiconductor devices to which so-called chemical mechanical polishing (hereinafter referred to as CMP) technology is applied, in processing of device wafers for producing semiconductor devices.

2. Discussion of Background

Progress of computer products has been remarkable in recent years, and parts to be used for such products, such as ULSI devices, have been developed for high integration and high speed, year after year. Along with such progress, the design rule for semiconductor devices has been progressively refined year after year, the depth of focus in a process for producing devices tends to be shallow, and planarization required for the pattern-forming surface tends to be increasingly strict.

Under these circumstances, there has been an attempt to accomplish the planarization by polishing, and presently, such a polishing process is used as one of many device producing processes. This polishing process is commonly referred to as CMP, and the frequency of its use is expected to increase also in future.

Presently, polishing compositions used in the CMP process employ, in many cases, a slurry having fumed silica dispersed in water, and they are mainly used for planarization of insulating films.

The slurry employing fumed silica, is usually one obtained by adding an alkali such as potassium hydroxide or ammonium, to fumed silica, followed by dispersion in water. The alkali is added to disperse the fumed silica stably in water, and to achieve a high stock removal rate for e.g. insulating films. Therefore, the pH of such a slurry is usually at least 9.

However, in the conventional fumed silica-containing slurry, fine fumed silica particles sometimes agglomerated. Impurities present in the slurry are considered to be the cause for such agglomeration. The mechanism is as illustrated in FIG. 1.

FIG. 1 illustrates a case where aluminum ions are present as the impurities. The slurry is alkaline, and fine silica particles are dispersed stably in the slurry when the impurities are not present. However, when the aluminum ions are present, hydroxyl groups in water will be coordinated with the aluminum ions. Dehydration-condensation takes place between the hydroxyl groups coordinated with the aluminum ions, and hydroxyl groups on the surface of fine silica particles. As a result, silicon atoms on the surfaces of the respective fine fumed silica particles will be bonded via the impurities, and thus, agglomeration is considered to take place.

Such an agglomeration phenomenon occurs at the time of polishing when heat and pressure are generated so that dehydration-condensation is likely to take place. The agglomerates produced at that time tend to produce scratches on the surface of a wafer during the polishing and consequently deteriorate the yield of the device. Further, atoms on the surface of the wafer and atoms on the surface of the fine silica particles will be bonded via impurities during the polishing, whereby fine silica particles will be attached on the surface of the wafer. The fine particles thus attached on the wafer surface, tend to remain even after the completion of the polishing, and they may not be removed by usual cleaning. The silica particles will thus remain on the wafer surface after the cleaning and further deteriorate the yield of the device.

Further, the slurry may be subjected to filtration to remove the agglomerates. Namely, it is common to remove the agglomerates present in the slurry by filtration of the slurry by means of a filter before use of the slurry, or by providing a filtration step in its recycling line when the slurry is used by recycling. However, when the silica particles pass through the filter, dehydration-condensation may take place by the water pressure, whereby agglomeration of the particles may take place. In other words, filtration to remove the agglomerates, may, rather, end up with producing agglomerates.

From such a viewpoint, a polishing composition is desired which is substantially free from agglomeration of fine silica particles at the time of polishing or filtration and thus scarcely produces polishing scratches by agglomerates, and which is readily cleansable after polishing.

SUMMARY OF THE INVENTION

The present invention is made to effectively solve the above-mentioned problems. Namely, it is an object of the present invention to provide a polishing composition which scarcely produces polishing scratches by agglomerates and which is readily cleansable after polishing.

The polishing composition of the present invention is one comprising the following components (a) to (c):

(a) colloidal silica;
(b) at least one bicarbonate selected from the group consisting of ammonium bicarbonate, lithium bicarbonate, potassium bicarbonate, sodium bicarbonate and a mixture thereof; and
(c) water;

wherein the concentration of each of the elements included in Groups 2A, 3A, 4A, 5A, 6A, 7A, 8A, 1B and 2B, lanthanoid and actinoid, and the concentration of each element of aluminum, gallium, indium, thallium, tin, lead, bismuth, fluorine and chlorine, are at most 100 ppb in the polishing composition, respectively.

The present invention thus provides a polishing composition which scarcely produces polishing scratches by agglomerates of fine silica particles and which is readily cleansable after polishing.

DETAILED DESCRIPTION OF THE PREFERRED EMBODIMENTS

(a) Colloidal Silica

Figure 1:
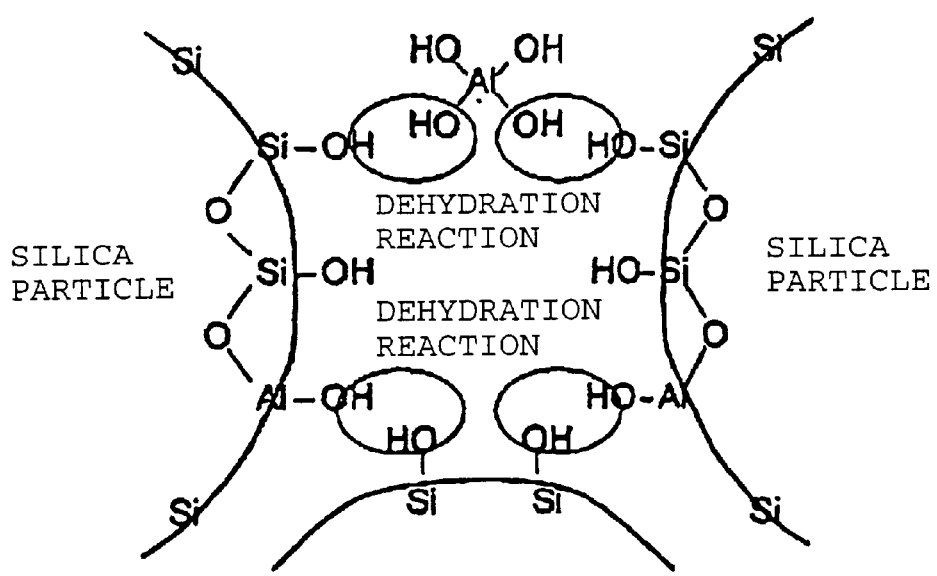
FIG. 1 is a schematic view illustrating the mechanism of agglomeration of fine silica particles in a conventional fumed silica-containing slurry.

The polishing composition of the present invention contains colloidal silica. The colloidal silica plays a role of mechanical polishing as an abrasive. Colloidal silica is known to have several crystal forms, and various methods for its production are also known. For the polishing composition of the present invention, colloidal silica containing little impurities is preferred so as not to impair the effects of the present invention. However, an optional one may be used regardless of its crystal form or production method. Particularly, colloidal silica prepared by a sol-gel method is preferred. The colloidal silica by a sol-gel method, is usually prepared by dissolving methyl silicate in a solvent comprising methanol, ammonium and water, and thereby hydrolyzing the methyl silicate. By such a method, it is possible to prepare a dispersion of colloidal silica containing little impurities.

As a method for the production of colloidal silica other than the sol-gel method, for example, a method for its production by heating silicon tetrachloride, or a method of subjecting sodium silicate to ionic exchange to grow colloidal silica, may be mentioned. However, in the method of using silicon tetrachloride as the starting material, chlorine may be included as an impurity in the colloidal silica thereby formed. Further, in the method of using sodium silicate as a raw material, metal impurities such as alkaline earth metals, copper, iron and chromium are usually contained in the raw material. Therefore, in a case where the colloidal silica produced by one of these methods is to be used, it is preferred to carry out a purification treatment to remove the impurities.

The content of the colloidal silica of the present invention based on the polishing composition, is usually within a range of from 10 to 25 wt %, preferably from 15 to 22 wt %, with a view to maintaining an appropriate stock removal rate, maintaining a stable dispersion state of the polishing composition and facilitating the production of the polishing composition. If the content of the colloidal silica is within the above range, an appropriate stock removal rate, specifically, from 300 to 2,000 Å/min, can be achieved, and the composition can be stored stably for a long period of time. From the viewpoint of shortening the process time, the stock removal rate is preferably high. However, in polishing for planarization of devices, if the stock removal rate is too high, there will be such a problem that it becomes difficult to control the removal amount by adjusting the polishing time, or that there will be an increase of formation of polishing scratches. Therefore, the stock removal rate is preferably adjusted to be within the above-mentioned range.

Further, the size of the colloidal silica to be used for the polishing composition of the present invention, is usually within a range of from 70 to 100 nm, as an average particle size calculated from the surface area (hereinafter referred to as a surface area-particle size), which is calculated from the surface area measured by a nitrogen absorption method (BET method) and the density of the particles. Further, the size is usually within a range of from 180 to 260 nm, preferably from 200 to 240 nm, as an average particle size (hereinafter referred to as an optically measured particle size) which is measured by an optical scattering method by means of an optical particle size measuring apparatus, such as COULTER N4 plus (manufactured by Beckman Coulter, Inc.). If the particle size of the colloidal silica is within this range, the stock removal rate can be properly maintained, and the polishing composition can be stably stored for a long period of time.

(b) Bicarbonate

The polishing composition of the present invention contains at least one bicarbonate selected from the group consisting of ammonium bicarbonate, lithium bicarbonate, potassium bicarbonate, sodium bicarbonate and a mixture thereof. Among these, it is preferred to employ ammonium bicarbonate with a view to preventing contamination of the surface of wafers after the polishing.

In the polishing composition of the present invention, the bicarbonate serves to provide a function to disperse the colloidal silica stably in the polishing composition. Such a function is considered to be generated because an electric double layer is easily and stably formed on the surface of the colloidal silica when the bicarbonate is present in the polishing composition. As a result, the viscosity of the entire polishing composition lowers, and such an effect that the handling of the polishing composition becomes easy, will also been obtained.

In the polishing composition of the present invention, the content of the bicarbonate is usually within a range of from 70 to 200 ppm, preferably from 80 to 150 ppm, with a view to maintaining the dispersion stability of fine silica particles in the polishing compound. The amount of the bicarbonate to be incorporated may be a minimum amount to maintain the dispersion stability of the colloidal silica, and is preferably small also from the viewpoint of economical efficiency or contamination of the surface of the wafer after the polishing.

(c) Water

The polishing composition of the present invention contains water as a medium. The water employed in the polishing composition of the present invention, may be any one of industrial water, city water, ion-exchanged water or distilled water, and preferably one substantially free from metal ions. It is particularly preferred to use one obtained by filtering ion-exchanged water substantially free from metal ions, to remove foreign matters.

(d) Hydrogen Peroxide

The polishing composition of the present invention preferably contains hydrogen peroxide. This hydrogen peroxide is employed to suppress propagation of e.g. bacteria, fungi and microbes in the polishing composition. Its content, if contained, is usually within a range of from 10 to 200 ppm, preferably from 20 to 150 ppm. The amount of hydrogen peroxide to be incorporated may be a minimum amount to achieve the above-mentioned object, and preferably small also from the viewpoint of economical efficiency or contamination of the surface of the wafer after the polishing.

Polishing composition

The polishing composition of the present invention is one comprising the above-mentioned components (a) to (d). And, it is necessary that the concentration of each of the elements included in Groups 2A, 3A, 4A, 5A, 6A, 7A, 8A, 1B and 2B, lanthanoid and actinoid, and the concentration of each element of aluminum, gallium, indium, thallium, tin, lead, bismuth, florin and chlorine, (hereinafter these elements may be referred to simply as impurities), are at most 100 ppb in the polishing composition, respectively. Further, the concentration of each of these elements is preferably at most 50 ppb. Thus, by minimizing the impurity elements in the polishing composition of the present invention, formation of polishing scratches can be substantially suppressed, and excellent cleansability can be obtained.

Further, when the polishing composition of the present invention contains hydrogen peroxide, decomposition of the hydrogen peroxide is suppressed. Namely, transition metals present in the composition as impurities, have a function to accelerate the decomposition of hydrogen peroxide, but in the polishing composition of the present invention having a significantly low content of such elements, the hydrogen peroxide is not readily decomposed. Therefore, the effect of hydrogen peroxide, namely the effect of suppressing propagation of e.g. bacteria, lasts for a long period of time, whereby the polishing composition can be stored stably for a long period of time.

The polishing composition of the present invention is produced by mixing and dissolving or dispersing the above-mentioned components. The order of incorporation of the components is not particularly restricted. Further, dissolution and dispersion may be carried out by an optional method, such as, stirring by a vane-type stirrer, or application of supersonic wave.

The polishing composition of the present invention is preferably filtered to remove coarse particles or undissolved foreign matters after mixing the above-mentioned components. When the filtration is carried out, it may be done by means of a filter having an opening size of at most 10 μm, preferably at most 5 μm, more preferably at most 1 μm. In order to prevent formation of polishing scratches by coarse particles or foreign matters potentially present in the raw material, it is preferred to carry out filtration when the polishing composition of the present invention is prepared.

The polishing composition of the present invention can be supplied in such a state that it can be used as a polishing composition, as it is. However, it may be prepared in the form of a polishing composition containing the above-mentioned compositions in higher concentrations, namely a concentrated polishing composition, so that at the time of use, it may be diluted to obtain a desired composition. Otherwise, it is also possible to prepare the composition dividedly in the form of two or more liquid formulations. For example, it may be divided into a first liquid comprising (a) colloidal silica and (c) water, and a second liquid comprising (d) hydrogen peroxide, (b) a bicarbonate and (c) water, and at the time of use, these two liquids will be mixed. Also from the viewpoint of storage-stability, dividing of the composition into two liquids may be advantageous.

Measurement of the concentrations of impurities can be performed by a commonly used analytical apparatus such as an inductively coupled plasma mass spectrometry (ICP-MS), an inductively coupled plasma atomic emission spectroscopy (ICP-AES) or an atomic absorption spectrophotometer. Further, e.g. ion chromatography may be used for measurement of fluorine or chlorine. pH The pH of the polishing composition of the present invention varies depending on the amounts of the respective components incorporated, but is usually within range of from 5 to 8, preferably from 6 to 7.5. By making the pH of the polishing composition close to neutral, the amount of hydroxyl groups in the composition is lowered, agglomeration of colloidal silica is particularly suppressed, and as a result, the effect of the present invention will be remarkable. Further, the polishing composition is preferably close to neutral also from the viewpoint of handling efficiency and safety, and also in consideration of the environment.

Among the components of the polishing composition of the present invention, the amount of the bicarbonate is most influential to the pH. The proper content of the bicarbonate is as described above. The polishing composition containing the proper amount of the bicarbonate, usually has a pH within the above-mentioned range. Here, the bicarbonate may be regarded as functioning as a buffer.

Electrical Conductivity

The polishing composition of the present invention usually has an electrical conductivity within a range of from 80 to 210 μS/cm, preferably from 90 to 160 μS/cm. Of the polishing composition of the present invention, the electrical conductivity depends mainly on the amount of the bicarbonate incorporated. The proper amount of the bicarbonate to be incorporated is as described above. The polishing composition containing the proper amount of the bicarbonate, usually has an electrical conductivity within the above-mentioned range. Further, when the impurities are present, the electrical conductivity of the polishing composition may change, and accordingly, the presence of impurities may sometimes be detected by measuring the electrical conductivity.

Viscosity

The polishing composition of the present invention has a viscosity of usually from 1.7 to 2.5 mPas, preferably from 1.8 to 2.3 mPas, as measured by an Ostwald's viscometer. With the polishing composition of the present invention, the viscosity tends to decrease when an electric double layer to be formed on the surface of silica particles present in the composition, is stably formed, and the dispersion stability will also be excellent at the same time. Here, like the above-mentioned electrical conductivity, the viscosity will be influenced by the amount of the bicarbonate incorporated. However, the polishing composition containing the proper amount of the bicarbonate usually has a viscosity within the above-mentioned range. The viscosity is preferably not too high so that high pressure is not required in the case of feeding the polishing composition through piping, clogging does not occur at a slender portion of the piping, and clogging of a filter does not occur frequently when the polishing composition is filtered by the filter.

Polishing Method

The polishing composition of the present invention is one to be used usually for polishing semiconductor devices. The polishing composition of the present invention may be combined with any conventional polishing method or polishing conditions.

For example, as a polishing machine, a single-side polishing machine, a double-side polishing machine, or others may be used. Further, as a polishing pad, suede type, nonwoven fabric type, flocked fabric type or raising type may, for example, be used. Further, in polishing of semiconductor devices, in order to further planalize the surface, polishing may be carried out in two or more steps. In such a multi-step polishing, the polishing composition of the present invention may be used for both the initial polishing and the final polishing, i.e. the finishing polishing. The polishing composition of the present invention is particularly preferably used for the finishing polishing, since formation of polishing-scratches is little, and little deposit such as abrasive remains on the surface after the polishing.

TEST 1

Colloidal silica dispersions having concentrations, surface area-particle sizes and optically measured particle sizes as identified in Table 1, were prepared by a sol-gel method. Here, the dispersion medium of the colloidal silica dispersions was totally substituted by water before the test. The content of impurity elements in each of the colloidal silica dispersions was at most 50 ppb.

Then, to each dispersion, 90 ppm of ammonium bicarbonate and 50 ppm of hydrogen peroxide, were incorporated, followed by filtration by a filter having an opening size of 5 μm, to obtain a polishing composition. In this manner, the polishing compositions of Examples 1 to 19 were obtained.

Further, as a Comparative Example, a commercially available fumed silica slurry (SS-25, manufactured by Cabot Microelectronics Corporation) was filtered by a filter having an opening size of 5 μm and used as a polishing composition (Comparative Example 1). Metal impurities in SS-25 were measured by an ICP spectroscopic analyzer, and the results were as follows:

Mg: less than 5 ppb, Al: 63 ppb, Ca: less than 30 ppb, Ti: 21 ppb, Cr: 344 ppb, Fe: 1,250 ppb, Ni: 153 ppb, Cu: less than 10 ppb, Zn: less than 10 ppb, Ag: less than 5 ppb, Pb: less than 30 ppb, Na: 1,491 ppb Using the polishing compositions of Examples 1 to 19 and Comparative Example 1, polishing and cleaning were carried out under the following polishing and cleaning conditions.

Polishing Conditions

Polishing machine: Single-side polishing machine for CMP (CMS200, manufactured by TOSHIBA MACHINE CO., LTD.)

Object to be polished: TEOS blanket wafer (8 inch wafer having a film formed by CVD)

Polishing pad: Laminated polishing pad made of polyurethane (IC-1000/Suba400, manufactured by Rodel Inc.)

Polishing pressure: 7 psi (about 50 kPa)

Polishing time: 90 sec

Platen rotational speed: 30 rpm

Carrier rotational speed: 32 rpm

Feed rate of polishing composition: 200 cc/min

Cleaning Conditions 1

Platen-rinsing (rinsing by water polishing)

Polishing pressure: 1 psi (about 7 kPa)

Polishing time: 20 sec

Platen rotational speed: 100 rpm

Carrier rotational speed: 103 rpm

Brush scrubbing: 60 sec

Dilute hydrofluoric acid (0.5%) spin-rinsing: 20 sec

Pure water spin-rinsing: 10 sec

Ultrasonic pure water spin-rinsing: 20 sec

Pure water spin-rinsing: 20 sec

Spin-drying: 20 sec

The thickness of the TEOS film was measured before and after the polishing and cleaning, and the stock removal rate was calculated from the difference in the thickness. Here, the thickness of the TEOS film was measured by means of a spectrometric film thickness measuring apparatus (VM-2030, manufactured by DAINIPPON SCREEN MFG. CO., LTD.). Further, the number of defects having a size of 0.2 μm or larger on the wafer surface after the polishing and cleaning, was measured by means of a surface defect measuring apparatus (SPITBI, manufactured by KLA-Tencor Corporation).

The summary of the results thus obtained is as follows.

TABLE 1

| | Colloidal silica concentration (wt %) | Surface area particle size (nm) | Optically measured particle size (nm) | Stock removal rate (Å/min) | Surface defects (pcs/wafer) |
|---|---|---|---|---|---|
| Ex. 1 | 5 | 90 | 220 | 250 | 15 |
| Ex. 2 | 10 | 90 | 220 | 500 | 20 |
| Ex. 3 | 15 | 90 | 220 | 700 | 25 |
| Ex. 4 | 20 | 90 | 220 | 1,000 | 30 |

TABLE 1-continued

| | Colloidal silica concentration (wt %) | Surface area particle size (nm) | Optically measured particle size (nm) | Stock removal rate (Å/min) | Surface defects (pcs/wafer) |
|---|---|---|---|---|---|
| Ex. 5 | 22 | 90 | 220 | 1,100 | 32 |
| Ex. 6 | 25 | 90 | 220 | 1,250 | 40 |
| Ex. 7 | 30 | 90 | 220 | 1,500 | 50 |
| Ex. 8 | 20 | 60 | 220 | 1,500 | 60 |
| Ex. 9 | 20 | 70 | 220 | 1,400 | 50 |
| Ex. 10 | 20 | 80 | 220 | 1,200 | 40 |
| Ex. 11 | 20 | 100 | 220 | 1,000 | 30 |
| Ex. 12 | 20 | 110 | 220 | 900 | 30 |
| Ex. 13 | 20 | 120 | 220 | 800 | 25 |
| Ex. 14 | 20 | 90 | 160 | 800 | 30 |
| Ex. 15 | 20 | 90 | 180 | 900 | 30 |
| Ex. 16 | 20 | 90 | 200 | 1,000 | 30 |
| Ex. 17 | 20 | 90 | 240 | 1,150 | 30 |
| Ex. 18 | 20 | 90 | 260 | 1,200 | 30 |
| Ex. 19 | 20 | 90 | 300 | 1,200 | 30 |
| Comp. Ex. 1 | — | — | — | 2,700 | 220 |

From the results in Table 1, it is evident that when polishing was carried out employing the polishing composition of the present invention, the number of surface defects was at a remarkably low level regardless of the surface area-particle size or the optically measured particle size of the colloidal silica employed. On the other hand, when the commercially available fumed silica slurry was employed, there were many surface defects.

TEST 2

Polishing scratches by repetitive cleaning, were evaluated by using the polishing composition of the above-mentioned Example 4 and the polishing composition of Comparative Example 1. Here, the purpose of the evaluation by the repetitive cleaning is to amplify the defects by polishing scratches formed on the surface of the TEOS film, by repetition of cleaning with dilute hydrofluoric acid, and also to remove colloidal silica attached on the wafer as much as possible. Namely, the purpose is to remove the colloidal silica remaining on the TEOS film by repeating the cleaning with dilute hydrofluoric acid, and to amplify very fine polishing scratches formed on the surface, by spin-rinsing with dilute hydrofluoric acid, thereby to detect very fine polishing scratches which were not detected by the surface defect measuring apparatus in Test 1.

Figure 2:
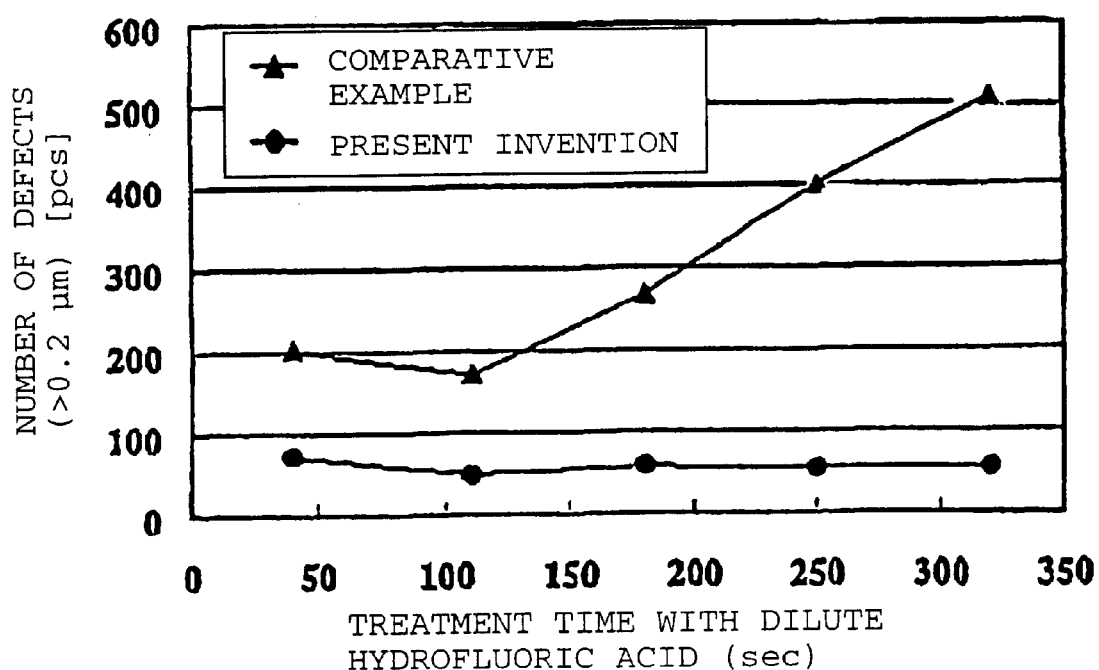
FIG. 2 is a graph showing a change in the number of defects by repetitive cleaning in Test 2.

Firstly, polishing was carried out under the same polishing conditions as in Test 1. Then, the first cleaning after the polishing was carried out under the above-mentioned cleaning conditions 1, except that the time for the spin-rinsing with dilute hydrofluoric acid was 40 sec. Thereafter, the surface defects of the TEOS film were measured, cleaning was carried out under the following cleaning conditions 2, and the surface defects were evaluated again. The cleaning under the cleaning conditions 2 and the evaluation of surface defects were repeated four times. The transition of surface defects by the repetitive cleaning is as shown in FIG. 2.

Cleaning Conditions 2

Dilute hydrofluoric acid (0.5%) spin-rinsing: 70 sec

Pure water spin-rinsing: 20 sec

Spin-drying: 20 sec

From the results shown in FIG. 2, it is evident that when the polishing composition of the present invention is employed, the number of surface defects does not increase even with the repetitive cleaning, and is always constant at a low level. On the other hand, when polishing was carried out by means of the fumed silica of Comparative Example 1, the number of defects increased as the cleaning was repeated, whereby it is evident that many very fine defects undetectable by usual measurement were formed on the surface of the TEOS film by the polishing.

TEST 3: Effect of Ammonium Bicarbonate

To the colloidal silica dispersion (concentration 20 wt %, surface area-particle size: 90 nm, optically measured particle size: 220 nm) as used in Example 4, ammonium bicarbonate was incorporated in various amounts as identified in Table 2, to obtain polishing compositions. Here, the concentration of hydrogen peroxide was constant at 20 ppm. Then, each polishing composition was filtered by a filter having an opening size of 5 μm. The filterability at that time was evaluated. Further, the electrical conductivity was measured by conductivity meter TS-12 (manufactured by HORIBA, LTD.), and the viscosity was measured by an Ostwald's viscometer. The results obtained are as shown in Table 2.

TABLE 2

| | Ammonium bicarbonate concentration (ppm) | Electrical conductivity (μ/cm) | Viscosity (mPas) | Filterability |
|---|---|---|---|---|
| Ex. 20 | 50 | 60 | 10 | Filtration took long time |
| Ex. 21 | 70 | 80 | 2.5 | No problem |
| Ex. 22 | 80 | 90 | 2.1 | No problem |
| Ex. 23 | 150 | 160 | 2.0 | No problem |
| Ex. 24 | 200 | 210 | 1.9 | No problem |
| Ex. 25 | 300 | 280 | 1.8 | No problem |
| Comp. Ex. 2 | 0 | 20 | 40 | Unable to be filtered |

TEST 4: Effect of hydrogen peroxide

To the colloidal silica dispersion (concentration 20 wt %, surface area-particle size: 90 nm, optically measured particle size: 220 nm) as used in Example 4, hydrogen peroxide was incorporated in various amounts as identified in Table 3, to obtain polishing compositions. Here, the concentration of ammonium bicarbonate was constant at 85 ppm. Then, each polishing compound was filtered by a filter having an opening size of 5 μm.

Each polishing composition thus obtained was sealed and stored at a temperature of 35° C. for three months, and after this, it was observed visually to see if bacteria propagated in the polishing composition. The results obtained, are as shown in Table 3.

TABLE 3

| | Hydrogen peroxide concentration (ppm) | Bacteria propagation status |
|---|---|---|
| Ex. 26 | 0 | Red bacteria colonies were observed at several portions |
| Ex. 27 | 5 | Slight red bacteria colonies were dotted about, but not problematic for practice use |
| Ex. 28 | 10 | No propagation of bacteria observed |
| Ex. 29 | 20 | No propagation of bacteria observed |
| Ex. 30 | 150 | No propagation of bacteria observed |
| Ex. 31 | 200 | No propagation of bacteria observed |
| | | No propagation of bacteria |

TABLE 3-continued

| | Hydrogen peroxide concentration (ppm) | Bacteria propagation status |
|---|---|---|
| Ex. 32 | 300 | observed. Casing slightly swelled due to vaporization of hydrogen peroxide. |

From the above results, it is evident that the polishing composition of the present invention can be stably stored for long period of time as long as it contains at least 10 ppm of hydrogen peroxide. Further, the Example not containing hydrogen peroxide is inferior in storage stability, but it exhibits the effect of the present invention that polishing scratches are not substantially formed by polishing.

TEST 5: Effect of pH

To the colloidal silica dispersion (concentration 20 wt %, surface area-particle size: 90 nm, optically measured particle size: 220 nm) as used in Example 4, 85 ppb of ammonium bicarbonate and 20 ppm of hydrogen peroxide were incorporated to obtain a polishing composition. This polishing composition was divided and the respective divided compositions were adjusted to the pH as identified in Table 5. Adjustment of pH was carried out with ammonium or carbonic acid. After the adjustment of pH, each polishing composition was filtered by a filter having an opening size of 5 μm, and the viscosity immediately after the preparation was measured.

The slurry thus prepared was sealed and stored at a temperature of 50° C. for one month, and after this, the viscosity (the viscosity after the storage for one month) was measured. Here, if precipitates were formed by the storage, they were sufficiently stirred to make the composition uniform, and then, the measurement was carried out. The results obtained are as shown in Table 4.

TABLE 4

| | | Viscosity (mpas) | |
|---|---|---|---|
| | pH | Immediately after preparation | After one month of storage |
| Ex. 33 | 4 | 5 | 5 |
| Ex. 34 | 5 | 2.5 | 2.5 |
| Ex. 35 | 6 | 2.2 | 2.2 |
| Ex. 36 | 7.5 | 2.1 | 2.1 |
| Ex. 37 | 8 | 2.4 | 2.5 |
| Ex. 38 | 9 | 10 | 10 |

From the above results, it is evident that with the compositions having a pH within a range of 4 to 9, the change in viscosity by the storage is small, if any.

TEST 6: Effect of Filtration

To the colloidal silica dispersion (concentration 20 wt %, surface area-particle size: 90 nm, optically measured particle size: 220 nm) as used in Example 4, 85 ppm of ammonium bicarbonate and 20 ppm of hydrogen peroxide were incorporated to obtain a polishing composition. No adjustment of pH was carried out. The polishing composition was divided, and the respective divided compositions were filtered by a filter having an opening size as identified in Table 5. Here, no filtration was carried out for the polishing composition of Example 39.

Using these polishing compositions, polishing, cleaning and evaluation of surface defects after polishing, were carried out under the same conditions as in Test 1. The results obtained are as follows.

TABLE 5

|        | Filter opening size (μm) | Surface defects (pcs/wafer) |
|--------|--------------------------|------------------------------|
| Ex. 39 | —                        | 150                          |
| Ex. 40 | 20                       | 70                           |
| Ex. 41 | 10                       | 40                           |
| Ex. 42 | 5                        | 30                           |
| Ex. 43 | 3                        | 20                           |
| Ex. 44 | 1                        | 15                           |

From the above results, it was confirmed that surface defects can be reduced by carrying out the filtration. Further, by performing the filtration by a filter having an opening size of at most 10 μm, the surface defects can be remarkably reduced, whereby it is evident that the polishing composition of the present invention is preferably filtered by means of a filter having an opening size of at most 10 μm.

The entire disclosure of Japanese Patent Application No. 2001-334107 filed on Oct. 31, 2001 including specification, claims, drawings and summary is incorporated herein by reference in its entirety.

What is claimed is:

1. A polishing composition comprising the following components (a) to (d):
   (a) colloidal silica;
   (b) ammonium bicarbonate;
   (c) water; and
   (d) hydrogen peroxide;

wherein each of the elements included in Groups 2A, 3A, 4A, 5A, 6A, 7A, 8A, 1B and 2B, lanthanoid and actinoid, and each element of aluminum, gallium, indium, thallium, tin; lead, bismuth, fluorine and chlorine, has a concentration of at most 100 ppb in the polishing composition, respectively.

2. The polishing composition according to claim 1, wherein the colloidal silica is one produced by a sol-gel method.

3. The polishing composition according to claim 1, wherein the colloidal silica has a particle size within a range of from 70 to 110 nm, based on the specific surface area, and the particle size of the colloidal silica as optically measured, is within a range of from 180 to 260 nm.

4. The polishing composition according to claim 1, wherein the content of the bicarbonate is within a range of from 70 to 220 ppm.

5. The polishing composition according to claim 1, wherein the content of hydrogen peroxide is within a range of 10 to 200 ppm.

6. The polishing composition according to claim 1, which has a pH within a range of from 5 to 8.

7. The polishing composition according to claim 1, which has an electrical conductivity within a range of from 80 to 210 μS/cm, and a viscosity within a range of from 1.7 to 2.5 mPas as measured by the Ostwald's viscometer.

8. A method which comprises polishing a semiconductor device with the polishing composition as defined in claim 1.

* * * * *